United States Patent
Mao et al.

(10) Patent No.: US 10,389,572 B2
(45) Date of Patent: Aug. 20, 2019

(54) CIRCUITS AND SYSTEMS FOR WIDEBAND QUADRATURE SIGNAL GENERATION

(71) Applicant: Integrated Device Technology, Inc., San Jose, CA (US)

(72) Inventors: Chuying Mao, Westford, MA (US); Ran Li, San Jose, CA (US); Jean-Marc Mourant, Dunstable, MA (US)

(73) Assignee: Integrated Device Technology, Inc., San Jose, CA (US)

( * ) Notice: Subject to any disclaimer, the term of this patent is extended or adjusted under 35 U.S.C. 154(b) by 152 days.

(21) Appl. No.: 15/632,093

(22) Filed: Jun. 23, 2017

(65) Prior Publication Data

US 2018/0375711 A1    Dec. 27, 2018

(51) Int. Cl.
*H04B 1/30* (2006.01)
*H04L 27/38* (2006.01)
(Continued)

(52) U.S. Cl.
CPC ......... *H04L 27/3863* (2013.01); *H03B 27/00* (2013.01); *H03C 3/40* (2013.01);
(Continued)

(58) Field of Classification Search
CPC ...... G01R 35/005; H03B 21/00; H03B 27/00; H03C 3/40; H03D 3/009; H03D 7/165; H04B 1/02; H04B 1/04; H04B 1/16; H04B 1/30; H04B 1/38; H04B 1/40; H04B 7/00; H04B 7/14; H04L 5/02; H04L 23/02; H04L 27/36; H04L 27/3863
(Continued)

(56) References Cited

U.S. PATENT DOCUMENTS

2005/0024544 A1* 2/2005 Waight ............... H03D 3/007
                                                  348/731
2007/0105518 A1* 5/2007 Chang ............... H03B 21/02
                                                  455/260
(Continued)

OTHER PUBLICATIONS

Kaukovuori, et al., Analysis and Design of Passive Polyphase Filters, IEEE Transactions On Circuits And Systems; 2008; Regular Papers, vol. 55, No. 10.; (15 pages).

*Primary Examiner* — Shawkat M Ali
(74) *Attorney, Agent, or Firm* — Haynes and Boone, LLP

(57) ABSTRACT

Wide band quadrature signal generation includes a frequency synthesizer generating a LO or 2×LO signal, a polyphase filter coupled to receive the LO signal and generate first in-phase and quadrature LO signals, a 2:1 frequency divider coupled to receive the 2×LO signal and generate second in-phase and quadrature LO signals, and a LO signal selector for selecting either the first or second in-phase LO signals as an output in-phase LO signal and either the first or second quadrature LO signals as an output quadrature LO signal based on an output frequency. In some embodiments, when the output frequency is above a threshold, the first in-phase and quadrature LO signals are selected as the output in-phase and quadrature LO signals and when the output frequency is at or below the threshold, the second in-phase and quadrature LO signals are selected as the output in-phase and quadrature LO signals.

20 Claims, 3 Drawing Sheets

(51) Int. Cl.
*H04L 5/02* (2006.01)
*H04L 27/00* (2006.01)
*H03D 3/00* (2006.01)
*H03D 7/16* (2006.01)
*H04L 23/02* (2006.01)
*H03C 3/40* (2006.01)
*H03B 27/00* (2006.01)

(52) U.S. Cl.
CPC .............. *H03D 3/009* (2013.01); *H03D 7/165* (2013.01); *H04B 1/30* (2013.01); *H04L 5/02* (2013.01); *H04L 23/02* (2013.01); *H04L 27/0014* (2013.01); *H04L 2027/0016* (2013.01); *H04L 2027/0018* (2013.01)

(58) Field of Classification Search
USPC ...... 331/37, 41, 45, 179; 375/219, 261, 295, 375/298, 316; 455/20, 73, 118, 260
See application file for complete search history.

(56) References Cited

U.S. PATENT DOCUMENTS

| | | | |
|---|---|---|---|
| 2007/0257737 A1* | 11/2007 | Van De Beek | H03D 3/009 331/76 |
| 2008/0055014 A1* | 3/2008 | Tsfaty | H03B 19/00 332/127 |
| 2009/0036069 A1* | 2/2009 | Seckin | H03D 7/1425 455/118 |
| 2009/0075601 A1* | 3/2009 | Nezhad-Ahmadi | H04B 1/006 455/73 |
| 2013/0278344 A1* | 10/2013 | Ding | H03B 27/00 331/45 |

\* cited by examiner

CIRCUITS AND SYSTEMS FOR WIDEBAND QUADRATURE SIGNAL GENERATION

FIELD

The present disclosure relates generally to signal transmission systems, and more particularly to circuits and systems for wideband quadrature signal generation.

BACKGROUND

A transmitter, such as a transmitter used by a 4G LTE Macro base station, often includes quadrature modulators and variable gain amplifiers. The transmitter typically up-converts quadrature baseband signals using two sinusoidal local oscillator (LO) signals that have the same frequency, but are out of phase with each other by 90 degrees. The transmitter does this by modulating one channel of data on a cosinusoidal carrier (the in-band or I data) and modulating the other channel of data on a sinusoidal carrier (the quadrature or Q data), with both carriers set to the same frequency. The two modulated carrier signals are then added together to form a composite signal that is transmitted via an antenna. Modern receivers have the ability to separate signals on these quadrature carriers, and to separate the I data from the Q data.

This type of transmitter is called a single sideband transmitter, because the image sideband is suppressed by mixing the quadrature baseband signals and quadrature LO signals in this fashion. In addition, by using these mathematical techniques rather than filtering, two channels of data can be transmitted within the same bandwidth, thus doubling spectral efficiency.

The composite signal generated by the transmitter often includes a desired sideband and an undesired image sideband due to imperfections in the modulation process. To reduce the effects of the image sideband (i.e., to have a higher image rejection), it is desirable to generate the quadrature LO signals so that they have good amplitude balance (i.e., they have approximately the same amplitude) and a good phase balance (i.e., a phase separation of approximately 90 degrees). This, however, is not always an easy task, especially for a wideband system, where a broad range of LO frequencies, such as with 4G LTE, is being supported.

Accordingly, it would be advantageous to have improved quadrature signal generation by generating respective LO signals with good amplitude and phase balance.

SUMMARY

According to an exemplary embodiment, a circuit for generating quadrature local oscillator (LO) signals includes a frequency synthesizer generating a first LO signal, a polyphase filter coupled to receive the first LO signal and generating a first in-phase LO signal and a first quadrature LO signal, a frequency divider coupled to receive the first LO signal and generating a second in-phase LO signal and a second quadrature LO signal, and a LO signal selector for selecting either the first or second in-phase LO signals as an output in-phase LO signal and selecting either the first or second quadrature LO signals as an output quadrature LO signal based on a desired output frequency for the output in-phase LO signal or the output quadrature LO signal.

According to another exemplary embodiment, a method of generating quadrature local oscillator (LO) signals includes generating a first LO signal, generating, using a polyphase filter and the first LO signal, a first in-phase LO signal and a first quadrature LO signal, generating, using a frequency divider and the first LO signal, a second in-phase LO signal and a second quadrature LO signal, and selecting either the first or second in-phase LO signals as an output in-phase LO signal and selecting either the first or second quadrature LO signals as an output quadrature LO signal based on a desired output frequency for the output in-phase LO signal or the output quadrature LO signal.

According to another exemplary embodiment, a quadrature modulator includes a quadrature local oscillator (LO) generator for generating an in-phase LO signal and a quadrature LO signal, the in-phase LO signal and the quadrature LO signal having a desired frequency, a first mixer modulating the in-phase LO signal using a I_BB signal, a second mixer modulating the quadrature LO signal using a second data signal, and a summer for combining the modulated in-phase carrier signal and the modulated quadrature carrier signal to form a composite signal. The LO generator generates the in-phase LO signal and the quadrature LO signal using a polyphase filter when the desired frequency is above a frequency threshold and generates the in-phase LO signal and the quadrature LO signal using a frequency divider when the desired frequency is at or below the frequency threshold. The in-phase LO signal and the quadrature LO signal have approximately a same amplitude and approximately a 90 degree phase shift when the desired frequency is within a range of operating frequencies for the transmitter.

DETAILED DESCRIPTION

Figure 1:
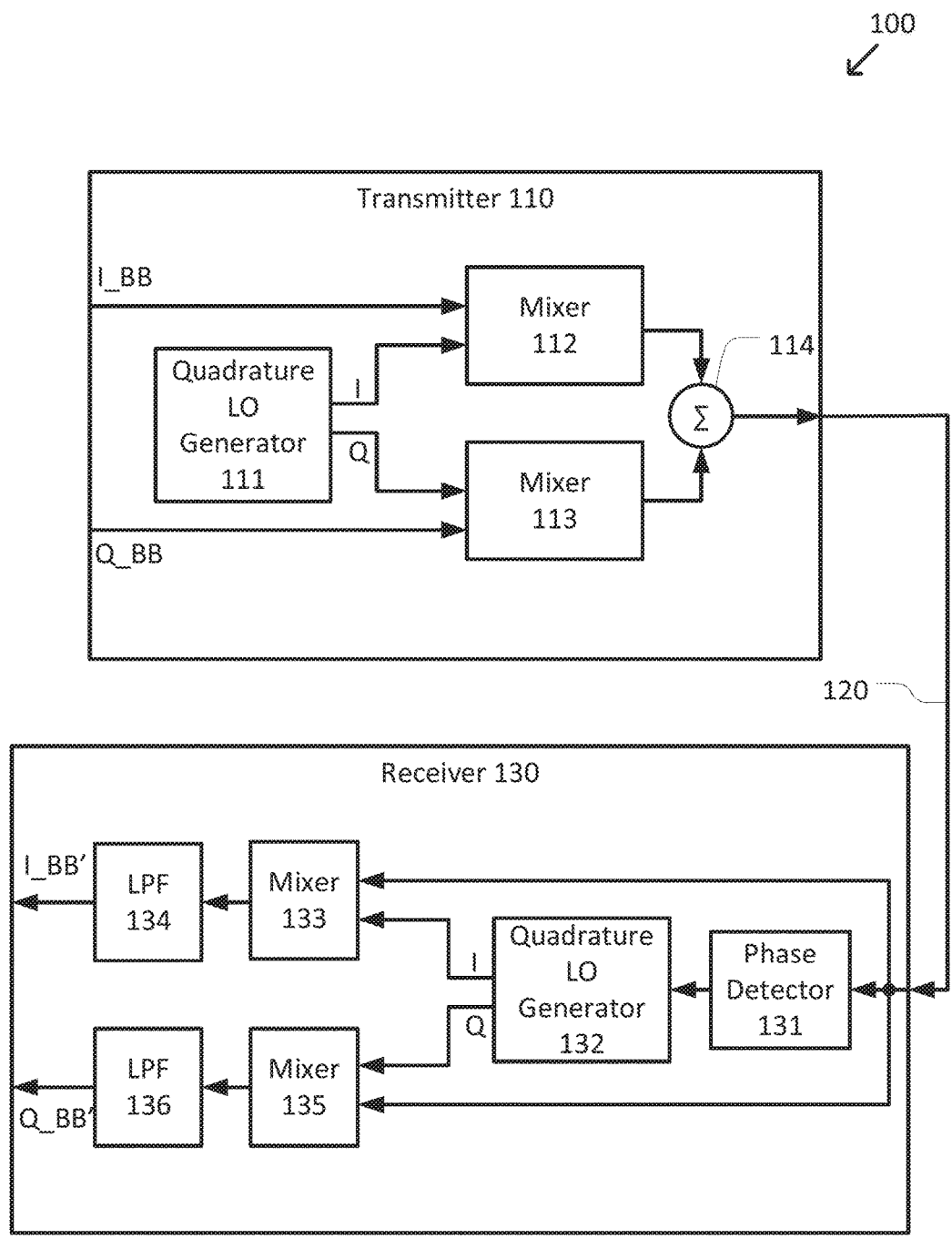
FIG. 1 is a simplified diagram of a quadrature modulation transmission and reception system according to some embodiments.

In the following description, reference is made to the accompanying drawings in which is shown, by way of illustration, specific embodiments of the present disclosure. Other embodiments may be utilized and changes may be made without departing from the scope of the disclosure. The following detailed description is not to be taken in a limiting sense, and the scope of the present invention is defined only by the appended claims.

Furthermore, specific implementations shown and described are only examples and should not be construed as the only way to implement or partition the present disclosure into functional elements unless specified otherwise herein. It will be readily apparent to one of ordinary skill in the art that the various embodiments of the present disclosure may be practiced by numerous other partitioning solutions. In addition, to avoid unnecessary repetition, one or more features shown and described in association with one embodiment may be incorporated into other embodiments unless specifically described otherwise or if the one or more features would make an embodiment non-functional.

In the following description, elements, circuits, and functions may be shown in block diagram form in order not to obscure the present disclosure in unnecessary detail. Additionally, block definitions and partitioning of circuits between various blocks is exemplary of a specific implementation. It will be readily apparent to one of ordinary skill in the art that the present disclosure may be practiced by numerous other partitioning solutions. Those of ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative circuits described in connection with the embodiments disclosed herein may be implemented or performed with a special-purpose device, a Digital Signal Processor (DSP), an Application-Specific Integrated Circuit (ASIC), discrete hardware components, or any combination thereof designed to perform the functions described herein.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed or that the first element must precede the second element in some manner. In addition, unless stated otherwise, a set of elements may comprise one or more elements.

FIG. 1 is a simplified diagram of a quadrature modulation transmission and reception system 100 according to some embodiments. As shown in FIG. 1, quadrature modulation transmission and reception system 100 includes a transmitter 110 coupled to a receiver 130 via a transmission medium 120. In some embodiments, transmission medium 120 may be wireless and/or include one or more conductors and/or one or more wave guides. Although not shown, in some examples, transmitter 110 may be part of a larger transmission unit and receiver 130 may be part of a larger receiver unit.

Transmitter 110 is designed to receive two quadrature baseband signals, I_BB and Q_BB, and generate a composite signal for transmission. A quadrature LO generator 111 generates both an in-phase (I) and quadrature (Q) LO signal at a desired LO frequency. The in-phase and quadrature LO signals are typically sinusoids at the desired LO frequency and have the same amplitude and a 90 degree phase difference.

Data signal I_BB and the in-phase LO signal are passed to a mixer 112. Mixer 112 up-converts data signal I_BB to the in-phase LO signal. The resulting modulated in-phase signal is then passed to summer 114. In some examples, mixer 112 may be a signal multiplier.

Similarly, data signal Q_BB and the quadrature LO signal are passed to a mixer 113. Mixer 113 up-convers data signal Q_BB to the quadrature LO signal. The resulting modulated quadrature signal is then passed to summer 114. In some examples, mixer 113 may be a signal multiplier.

Summer 114 adds the modulated in-phase signal and the modulated quadrature signal together to form a composite signal that is transmitted via an antenna. Due to imperfections in the quadrature LO signal, the composite signal typically includes both a desired sideband component and an undesired image component. For acceptable recovery of the I_BB and Q_BB data signals at a receiver, the undesired image has to be low enough to meet spectral mask specifications.

At receiver 130, the composite signal is sent to a phase detector 131 and mixers 133 and 135. Phase detector 131 examines the composite signal and generates a phase reference that can be used to synchronize the phases of the in-phase and quadrature LO signals as generated in transmitter 110 by quadrature LO generator 111 and the in-phase and quadrature LO signals generated in receiver 130 by quadrature LO generator 132. This synchronization accounts for any phase shift introduced in transmitter 110, transmission medium 120, and/or receiver 130. In some embodiments, phase detector 131 may further include a frequency offset to account for Doppler frequency shifts due to relative motion between transmitter 110 and receiver 130.

Quadrature LO generator 132 generates both an in-phase (I) and quadrature (Q) LO signals at the desired frequency with a synchronizing phase shift provided by phase detector 131. The in-phase and quadrature LO signals are typically sinusoids at the desired frequency and have the same amplitude and a 90 degree phase difference.

The in-phase LO signal provided by quadrature LO generator 132 is passed to mixer 133 where it is mixed with the composite signal received at receiver 130. Mixer 133 typically multiplies the received composite signal and the in-phase LO signal and generates a recovered version of I_BB and a signal at twice the desired frequency. The signal at twice the desired frequency is removed by low-pass filter 134 leaving the recovered version of the in-phase data signal I_BB'.

Similarly, the quadrature LO signal provided by quadrature LO generator 132 is passed to mixer 135 where it is mixed with the composite signal received at receiver 130. Mixer 135 typically multiplies the received composite signal and the quadrature LO signal and generates a recovered version of Q_BB and a signal at twice the desired frequency. The signal at twice the desired frequency is removed by low-pass filter 136 leaving the recovered version of the quadrature data signal Q_BB'.

Ideally, the recovered version of the data signal I_BB' and the original version of the data signal I_BB are the same and the recovered version of the data signal Q_BB' and the original version of the data signal Q_BB are the same. In practice, however, imperfections in the modulation of transmitter 110 and the demodulation of receiver 130 result in differences between the recovered and original versions of the data signals.

One way of reducing image signal generated by the transmitter modulation is to have quadrature LO generators 111 and 132 generate in-phase and quadrature signals with both a good amplitude balance and a good phase balance. A good amplitude balance corresponds to the magnitudes of the in-phase and quadrature LO signals remaining equal or nearly equal. In some examples, a good amplitude balance corresponds to the magnitudes of the in-phase and quadrature LO signals being within 0.3 dB of each other. A good phase balance corresponds to maintaining the phase shift between the in-phase and quadrature LO signals at or close to 90 degrees. In some examples, a good phase balance corresponds to the phase between the in-phase and quadrature LO signals staying within 83 and 93 degrees of each other. When good amplitude and phase balance is maintained, the composite signal includes a strong desired sideband component and a weak image sideband component so that image rejection is kept as high as possible.

Accordingly, the design and implementation of quadrature LO generators 111 and 132 plays an important role in the ability of quadrature transmission and reception system 100 to successfully recover data signals I_BB and Q_BB at receiver 130.

Figure 2:
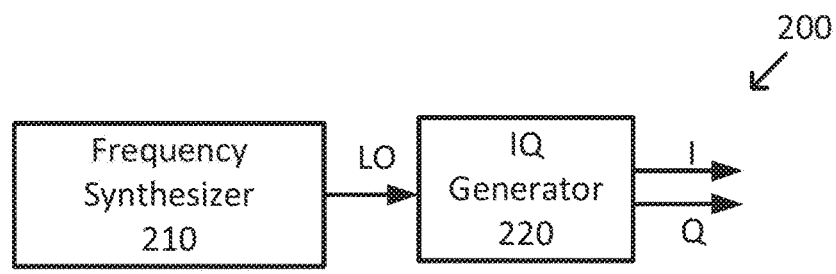
FIG. 2 is a simplified diagram of a quadrature LO generator according to some embodiments.

FIG. 2 is a simplified diagram of a LO quadrature generator 200 according to some embodiments. In some embodiments, LO quadrature generator 200 may be used for quadrature LO generator 111 and/or 132 from FIG. 1. As shown in FIG. 2, LO quadrature generator 200 includes a frequency synthesizer 210 and an in-phase/quadrature signal generator (IQ generator) 220. Frequency synthesizer 210 generates a local oscillator (LO) signal at a suitable frequency. In some examples, the suitable frequency is twice the desired LO frequency for the in-phase and quadrature LO signals. In some examples, frequency synthesizer 210 may include a phase-locked loop (PLL) or other similarly functioning circuitry to generate the LO signal. The LO signal is passed to IQ generator 220 to generate the in-phase (I) and quadrature (Q) LO signals. Several techniques, including frequency division and polyphase filters, may be used by IQ generator 220 to generate the in-phase and quadrature LO signals from the LO signal.

Figure 3:
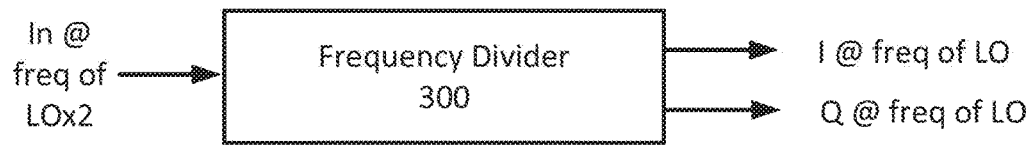
FIG. 3 is a simplified diagram of a frequency divider according to some embodiments.

FIG. 3 is a simplified diagram of a frequency divider 300 according to some embodiments. In some embodiments, frequency divider 300 may be used as part of IQ generator 220. As shown in FIG. 3, frequency divider 300 receives an input signal have a frequency of twice the desired LO frequency and generates both an in-phase (I) LO signal and a quadrature (Q) LO signal at the desired LO frequency.

Figure 4:
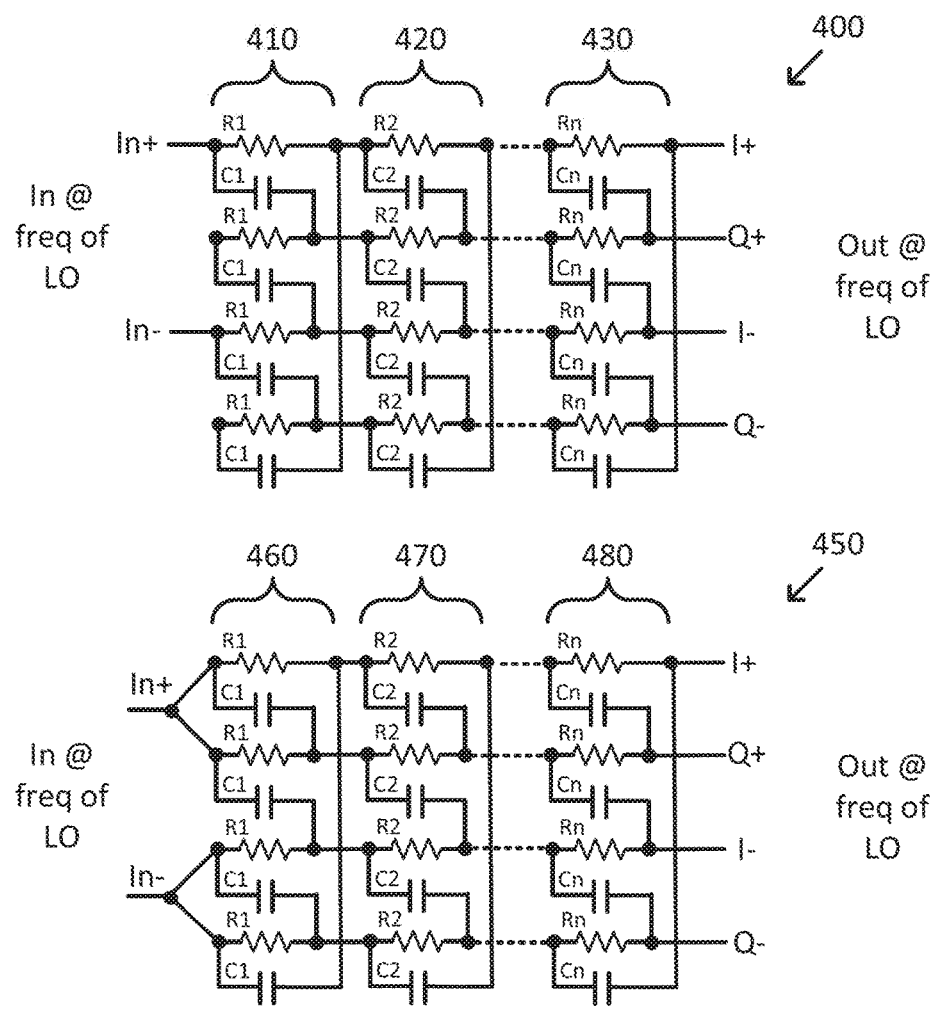
FIG. 4 is a simplified diagram of polyphase filters according to some embodiments.

FIG. 4 is a simplified diagram of polyphase filters 400 and 450 according to some embodiments. In some embodiments, polyphase filters 400 and/or 450 may be used as part of IQ generator 220. As shown in FIG. 4, polyphase filter 400 receives a signal at the desired LO frequency and is built around a multi-stage RC filtering network. Each of the n stages (shown via representative stages 410, 420, and 430) includes a similarly interconnected set of four same valued resistors (shown as Ri in stage i) and four capacitors (shown as Ci in stage i), although the resistor and capacitor values may be different in different stages. Stage 410 is the input stage for polyphase filter 400. A first resister includes a first terminal connected to a first side of an input signal (e.g., from one side of a frequency synthesizer, such as frequency synthesizer 210, that generates a differential output) and a second terminal connected to a first output of stage 410. A first capacitor includes a first terminal connected to the first terminal of the first resistor and a second terminal connected to a second output of stage 410. A second resistor includes a first terminal connected to a first terminal of a second capacitor. A second terminal of the second resistor is connected to the second terminal of the first capacitor and the second output of stage 410. The second terminal of the second capacitor is connected to a third output of stage 410. A third resister includes a first terminal connected to a second side of the input signal and a second terminal connected to the second terminal of the second capacitor and the third output of stage 410. A third capacitor includes a first terminal connected to the first terminal of the third resistor and a second terminal connected to a fourth output of stage 410. A fourth resistor includes a first terminal connected to a first terminal of a fourth capacitor. A second terminal of the fourth resistor is connected to the second terminal of the third capacitor and the fourth output of stage 410. The second terminal of the fourth capacitor is connected to the second terminal of the first resistor and the first output of stage 410.

The interconnections among the resistors and capacitors of stage 420 are similar to that of stage 410 except that the first terminals of the first resistor and first capacitor are a first input for stage 420 connected to the first output of stage 410, the first terminals of the second resistor and second capacitor are a second input for stage 420 connected to the second output of stage 410, the first terminals of the third resistor and third capacitor are a third input for stage 420 connected to the third output of stage 410, and the first terminals of the fourth resistor and fourth capacitor are a fourth input for stage 420 connected to the fourth output of stage 410.

Subsequent stages of polyphase filter 400 are connected similar to stage 420 with the first through fourth inputs of the stage being connected to the first through fourth outputs, respectively, of the previous stage. The first and third outputs of the last (nth) stage 430 are the differential outputs (I+ and I−) of the in-phase LO signal, and the second and fourth outputs of stage 430 are the different outputs (Q+ and Q−) of the quadrature LO signal.

Polyphase filter 450 similarly receives a signal at the desired frequency and includes n stages (shown via representative stages 460, 470, and 480). The internal interconnection of resistors and capacitors in polyphase filter 450 is similar to the internal interconnections of resistors and capacitors in polyphase filter 400. Polyphase filter 450 differs from polyphase filter 400 in that the first side of the input signal is connected to the first terminals of the first resistor, the first capacitor, the second resistor, and the second capacitor and the second side of the input signal is connected to the first terminals of the third resistor, the third capacitor, the fourth resistor, and the fourth capacitor.

In practice, none of frequency divider 300, polyphase filter 400, and polyphase filter 450 is flexible enough to support a quadrature transmission and reception system, such as quadrature transmission and reception system 100, over a broad range of possible LO frequencies and with reasonable power consumption. For example, a quadrature transmission and reception system that is designed to flexibly operate with LO frequencies in the range of 0.5 GHz to 3 GHz may not be able to operate effectively across this broad range of LO frequencies using just a frequency divider or a polyphase filter. In some examples, frequency divider 300 begins to exhibit poor amplitude and phase balance above 1.15 GHz and especially above 2 GHz. And although some improvements in amplitude and phase balance are possible by increasing the power used by frequency divider 300, the frequency range is still practicably limited to less than 2 GHz.

In some examples, polyphase filters 400 and 450 exhibit better amplitude and phase balance at frequencies above 1 GHz, but have a poor amplitude and phase balance at lower frequencies. In some examples, polyphase filter 400 further provides good phase balance across a wide range in frequencies, but has an amplitude balance that deteriorates as the desired LO frequency diverges from the RC pole frequencies of stages 410-430. In some examples, polyphase filter 450 further provides good amplitude balance across a wide range in frequencies, but has a phase balance that deteriorates as the desired LO frequency diverges from the RC pole frequencies of stages 460-480.

Accordingly, a broad frequency range quadrature transmission and reception system is not practical using frequency dividers or polyphase filters alone. However, a hybrid approach using both a frequency divider and a polyphase filter is able to provide both good amplitude and good phase balance across a full range of LO frequencies, such as those between 0.5 Hz and 3 GHz. The choice of whether to use the frequency divider or the polyphase filter to generate the in-phase and quadrature LO signals is made based on the desired LO frequency. In some examples, the frequency divider is used for lower desired LO frequencies (e.g., from 0.5 GHz up to and including 1.15 GHz) and the polyphase filter is used for higher desired LO frequencies (e.g., from 1.15 GHz up to and including 3 GHz). In some examples, the hybrid approach may have the added advantage of providing an analog-only solution to the generation of in-phase and quadrature LO signals with good amplitude and phase balance.

Figure 5:
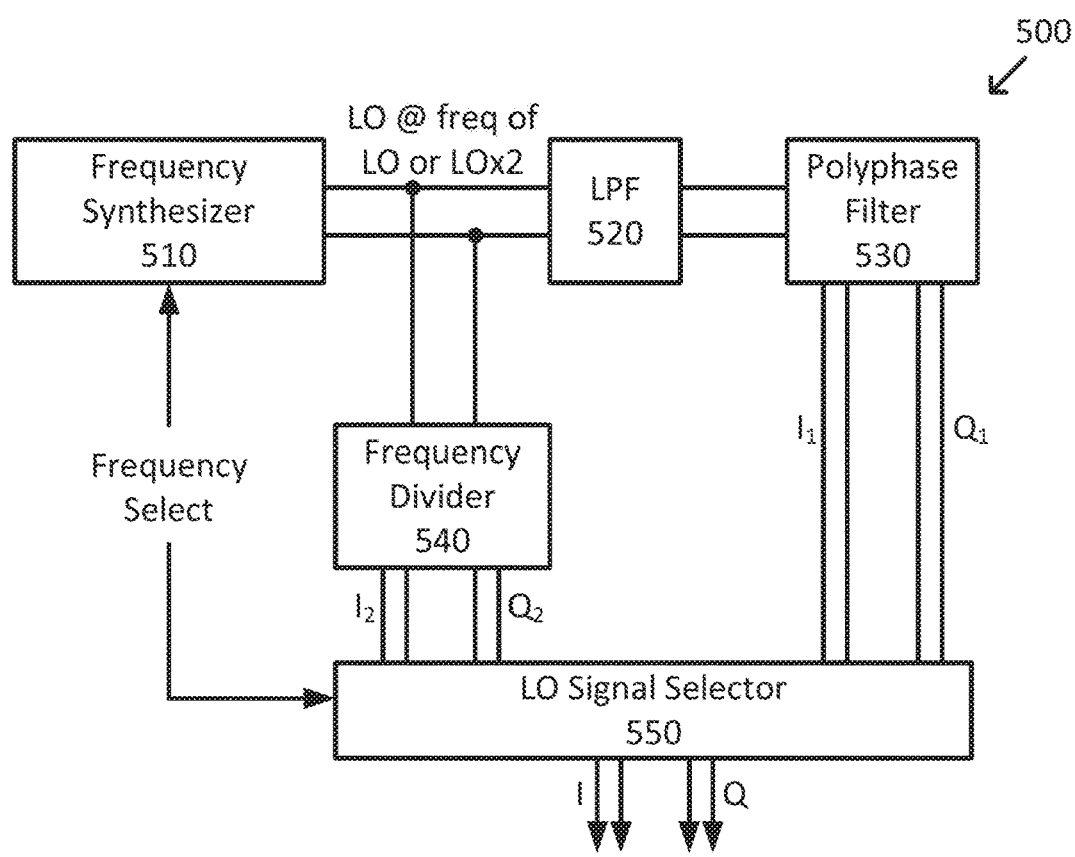
FIG. 5 is a simplified diagram of another quadrature LO generator according to some embodiments.

FIG. 5 is a simplified diagram of a quadrature LO generator 500 according to some embodiments. In some embodiments, quadrature LO generator 500 may be used for quadrature LO generator 111 and/or 132 from FIG. 1. As shown in FIG. 5, quadrature LO generator 500 includes a frequency synthesizer 510. Similar to frequency synthesizer 210, frequency synthesizer 510 generates a differential local oscillator (LO) signal at a suitable frequency, which is shown in FIG. 5 as a differential signal. In some examples, the frequency is selected based on a desired LO frequency for a corresponding transmitter or receiver and may alternatively be selected by an operator, a processor circuit (not shown), and/or some other suitable method as indicated by the frequency select input of frequency synthesizer 510. In some examples, the frequency is either the desired LO frequency, when a polyphase filter 530 is used to generate the in-phase and quadrature LO signals, or twice the desired LO frequency, when a frequency divider 540 is used to generate the in-phase and quadrature LO signals. In some examples, frequency synthesizer 510 may include a phase-locked loop (PLL) or other similarly functioning circuitry to generate the LO signal. The LO signal is then passed to low-pass filter 520 and frequency divider 540.

Low-pass filter 520 is used to remove higher harmonics from the LO signal. In some examples, the cut-off frequency of low-pass filter 520 may be approximately 1.5× the frequency of the primary frequency of the LO signal. In some examples, low-pass filter 520 may be a first, second, or higher-order filter. In some examples, low-pass filter 520 may be a passive or an active filter. In some examples, low-pass filter 520 may be an elliptical filter, a Butterworth filter, a Chebyshev filter, a Bessel filter, a Cauer filter, and/or the like. The filtered LO signal is passed to a polyphase filter 530.

Polyphase filter 530 receives the filtered LO signal and generates differential candidate in-phase ($I_1$) and quadrature ($Q_1$) LO signals. In some examples, polyphase filter 530 is consistent with polyphase filter 400 and/or polyphase filter 450. The $I_1$ and $Q_1$ candidate in-phase and quadrature LO signals are then passed to a LO signal selector 550. In some examples, the $I_1$ and $Q_1$ candidate in-phase and quadrature LO signals are suitable for use at higher frequencies, such as frequencies at or above 1.15 GHz.

Frequency divider 540 receives the LO signal and generates differential candidate in-phase ($I_2$) and quadrature ($Q_2$) LO signals. In some examples, frequency divider 540 is consistent with frequency divider 300. The $I_2$ and $Q_2$ candidate in-phase and quadrature LO signals are then passed to LO signal selector 550. In some examples, the $I_2$ and $Q_2$ candidate in-phase and quadrature LO signals are suitable for use at lower frequencies, such as frequencies at or below 1.15 GHz.

LO signal selector 550 is used to select between the $I_1$ and $Q_1$ and the $I_2$ and $Q_2$ candidate in-phase and quadrature LO signals to provide I and Q in-phase and quadrature LO signals (e.g., as differential LO signals) to other parts of a quadrature system. In some examples, LO signal selector 550 uses the frequency select input that is also supplied to frequency synthesizer 510 to determine whether quadrature LO generator 500 is operating at low frequencies or high frequencies. In some examples, the low frequencies may correspond to frequencies at or below 1.15 GHz and high frequencies may correspond to frequencies above 1.15 GHz. When LO signal selector 550 determines that quadrature LO generator 500 is operating at high frequencies, the $I_1$ and $Q_1$ candidate in-phase and quadrature LO signals are selected as the in-phase and quadrature LO signals supplied as I and Q, respectively. When LO signal selector 550 determines that quadrature LO generator 500 is operating at low frequencies, the $I_2$ and $Q_2$ candidate in-phase and quadrature LO signals are selected as the in-phase and quadrature LO signals supplied as I and Q, respectively. In some examples, LO signal selector 550 may include one or more multiplexors for selecting between the candidate in-phase and quadrature LO signals.

As discussed above and further emphasized here, FIG. 5 is merely an example which should not unduly limit the scope of the claims. One of ordinary skill in the art would recognize many variations, alternatives, and modifications. In some embodiments, LO signal selector 550 may include a frequency detector and comparator that determines which of the in-phase and quadrature LO signals from polyphase filter 530 ($I_1$ and $Q_1$) or the in-phase and quadrature LO signals from frequency divider 540 ($I_2$ and $Q_2$) based on the observed frequencies of one or more of the candidate in-phase and quadrature LO signals. In some examples, the use of the frequency detector and comparator may eliminate the frequency select input on LO signal selector 550.

In some embodiments, quadrature LO generator 500 may operate in a reduced power mode. In some examples, the reduced power mode may include disabling low-pass filter 520 and/or polyphase filter 530 when quadrature LO generator 500 is generating the in-phase and quadrature LO signals at low frequency and/or disabling frequency divider 540 when quadrature LO generator 500 is generating the in-phase and quadrature LO signals at high frequency.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

What is claimed is:

1. A circuit for generating quadrature local oscillator (LO) signals, the circuit comprising:
   a frequency synthesizer for generating a first LO signal;
   a polyphase filter for receiving the first LO signal and generating a first in-phase LO signal and a first quadrature LO signal;

a frequency divider for receiving the first LO signal and generating a second in-phase LO signal and a second quadrature LO signal; and a LO signal selector for selecting either the first or second in-phase LO signals as an output in-phase LO signal and selecting either the first or second quadrature LO signals as an output quadrature LO signal based on a desired output frequency for the output in-phase LO signal or the output quadrature LO signal.

2. The circuit of claim 1, further comprising a low-pass filter coupled between the frequency synthesizer and the polyphase filter.

3. The circuit of claim 1, wherein the LO signal selector:
selects the first in-phase LO signal as the output in-phase LO signal when the desired output frequency is above a threshold frequency;
selects the first quadrature LO signal as the output quadrature LO signal when the desired output frequency is above the threshold frequency;
selects the second in-phase LO signal as the output in-phase LO signal when the desired output frequency is at or below the threshold frequency; and
selects the second quadrature LO signal as the output quadrature LO signal when the desired output frequency is at or below the threshold frequency.

4. The circuit of claim 3, wherein the threshold frequency is 1.15 GHz.

5. The circuit of claim 1, wherein the desired output frequency is determined based on a frequency select input provided to the LO signal selector.

6. The circuit of claim 5, wherein the frequency select input is provided to the frequency synthesizer to set a frequency of the first LO signal.

7. The circuit of claim 1, wherein the LO signal selector comprises one or more multiplexors.

8. The circuit of claim 1, wherein the LO signal selector comprises a frequency detector for determining the desired output frequency based on a frequency of the first in-phase LO signal, a frequency of the second in-phase LO signal, a frequency of the first quadrature LO signal, or a frequency of second quadrature LO signal.

9. The circuit of claim 1, wherein the output in-phase LO signal and the output quadrature LO signal have a same amplitude and a 90 degree phase shift when the desired output frequency is within a range of operating frequencies for the circuit.

10. The circuit of claim 9, wherein the range of operating frequencies extends from 0.5 GHz to 3 GHz.

11. A method of generating quadrature local oscillator (LO) signals, the method comprising:
generating a first LO signal;
generating, utilizing a polyphase filter and the first LO signal, a first in-phase LO signal and a first quadrature LO signal;
generating, utilizing a frequency divider and the first LO signal, a second in-phase LO signal and a second quadrature LO signal; and
selecting either the first or second in-phase LO signals as an output in-phase LO signal and selecting either the first or second quadrature LO signals as an output quadrature LO signal based on a desired output frequency for the output in-phase LO signal or the output quadrature LO signal.

12. The method of claim 11, wherein the selecting comprises:
selecting the first in-phase LO signal as the output in-phase LO signal when the desired output frequency is above a threshold frequency;
selecting the first quadrature LO signal as the output quadrature LO signal when the desired output frequency is above the threshold frequency;
selecting the second in-phase LO signal as the output in-phase LO signal when the desired output frequency is at or below the threshold frequency; and
selecting the second quadrature LO signal as the output quadrature LO signal when the desired output frequency is at or below the threshold frequency.

13. The method of claim 11, further comprising low-pass filtering the first LO signal before providing it to the polyphase filter.

14. The method of claim 11, further comprising disabling the polyphase filter or the frequency divider based on the desired output frequency.

15. The method of claim 11, wherein the output in-phase LO signal and the output quadrature LO signal have a good amplitude balance and a good phase balance when the desired output frequency is within a range of operating frequencies extending from 0.5 GHz to 3 GHz.

16. A quadrature modulator, the modulator comprising:
a quadrature local oscillator (LO) generator for generating an in-phase LO signal and a quadrature LO signal, the in-phase LO signal and the quadrature LO signal having a desired frequency;
a first mixer for modulating the in-phase LO signal utilizing a first data signal;
a second mixer for modulating the quadrature LO signal utilizing a second data signal; and
a summer for combining the modulated in-phase LO signal and the modulated quadrature LO signal to form a composite signal;
wherein:
the quadrature LO generator generates the in-phase LO signal and the quadrature LO signal utilizing a polyphase filter when the desired frequency is above a frequency threshold and generates the in-phase LO signal and the quadrature LO signal utilizing a frequency divider when the desired frequency is at or below the frequency threshold; and
the in-phase LO signal and the quadrature LO signal have a same amplitude and a 90 degree phase shift when the desired frequency is within a range of operating frequencies for the modulator.

17. The quadrature modulator of claim 16, wherein:
the frequency threshold is 1.15 GHz; and
the range of operating frequencies extends from 0.5 GHz to 3 GHz.

18. The quadrature modulator of claim 16, wherein:
the polyphase filter generates a first candidate in-phase LO signal and a first candidate quadrature LO signal;
the frequency divider generates a second candidate in-phase LO signal and a second candidate quadrature LO signal; and
the quadrature LO generator further comprises a LO signal selector that:
selects the first candidate in-phase LO signal as the in-phase LO signal when the desired frequency is above the frequency threshold;
selects the first candidate quadrature LO signal as the quadrature LO signal when the desired frequency is above the frequency threshold;

selects the second candidate in-phase LO signal as the in-phase LO signal when the desired frequency is at or below the frequency threshold; and selects the second candidate quadrature LO signal as the quadrature LO signal when the desired frequency is at or below the frequency threshold.

19. The quadrature modulator of claim 18, wherein the desired frequency is determined based on a frequency select input provided to the LO signal selector.

20. The quadrature modulator of claim 16, wherein the quadrature modulator operates in a low-power mode where the polyphase filter or the frequency divider is disabled based on the desired frequency.

\* \* \* \* \*